(12) United States Patent
Lim et al.

(10) Patent No.: US 7,323,406 B2
(45) Date of Patent: Jan. 29, 2008

(54) ELEVATED BOND-PAD STRUCTURE FOR HIGH-DENSITY FLIP-CLIP PACKAGING AND A METHOD OF FABRICATING THE STRUCTURES

(75) Inventors: Victor Seng-Keong Lim, Singapore (SG); Fan Zhang, Singapore (SG); Jeffrey Lam, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 312 days.

(21) Appl. No.: 11/044,282

(22) Filed: Jan. 27, 2005

(65) Prior Publication Data

US 2006/0166402 A1   Jul. 27, 2006

(51) Int. Cl.
*H01L 21/44* (2006.01)

(52) U.S. Cl. .................. 438/622; 257/E23.01
(58) Field of Classification Search ........... 438/5–7, 438/10–11, 104, 107–114, 118, 121–123, 438/128–129, 135, 142, 145, 149, 151, 157, 438/176, 478, 184, 195–198, 200–211, 218, 438/237, 165, 248, 268, 343, 294, 308, 337
See application file for complete search history.

(56) References Cited

U.S. PATENT DOCUMENTS

| | | | |
|---|---|---|---|
| 5,251,806 A * | 10/1993 | Agarwala et al. ...... 228/180.22 |
| 5,523,920 A | 6/1996 | Machuga et al. ........... 361/767 |
| 5,891,756 A | 4/1999 | Erickson .................... 438/108 |
| 6,037,213 A * | 3/2000 | Shih et al. .................. 438/253 |
| 6,124,165 A * | 9/2000 | Lien ........................... 438/253 |
| 6,376,353 B1 | 4/2002 | Zhou et al. ................. 438/612 |
| 6,544,880 B1 | 4/2003 | Akram ....................... 438/617 |
| 6,578,754 B1 | 6/2003 | Tung ..................... 228/180.22 |
| 6,692,629 B1 | 2/2004 | Chen et al. ................. 205/123 |
| 6,770,547 B1 | 8/2004 | Inoue et al. ................ 438/496 |
| 2002/0121692 A1 | 9/2002 | Lee et al. .................... 257/737 |
| 2004/0157450 A1 | 8/2004 | Bojkov et al. ............. 438/689 |
| 2006/0057836 A1* | 3/2006 | Nagarajan et al. ......... 438/622 |

* cited by examiner

*Primary Examiner*—Michael Lebentritt
*Assistant Examiner*—Andre' Stevenson

(57) ABSTRACT

A method for making novel elevated bond-pad structures with sidewall spacers is achieved. The elevated bond-pad structures increase the space between the chip and a substrate during flip-chip bonding. The increased spacing results in better under-filling and reduces alpha particle soft errors in the chip. The sidewall spacers restrict the wetting surface for the PbSn solder bumps to the top surface of the bond pads. This results in smaller solder bumps and allows for closer spacings of the array of bonding pads for higher density integrated circuits.

18 Claims, 5 Drawing Sheets

ELEVATED BOND-PAD STRUCTURE FOR HIGH-DENSITY FLIP-CLIP PACKAGING AND A METHOD OF FABRICATING THE STRUCTURES

BACKGROUND OF THE INVENTION (1) Field of the Invention

The present invention relates to the fabrication of integrated circuit devices on semiconductor chips, and more particularly relates to making improved elevated bond-pad structures for bonding chips on and to a substrate using flip-chip technology. These elevated bond-pad structures are particularly useful for increasing the density of the input/output (I/O) bond pads on a chip while reducing electrical shorts between closely spaced (adjacent) solder balls (bumps) on the array of pads. The elevated bond pads increase the spacing between chip and substrate during bonding for improved under-fill flow rates, and also reduce Alpha ($\alpha$) particle emission from Pb/Sn solder balls or bumps into the semiconductor chip.

(2) Description of the Prior Art

In recent years there has been a renewed interest in replacing the conventional wire bond techniques with flip-chip bonding techniques to increase circuit performance and reduce package size. In the flip-chip method lead/tin (Pb/Sn) solder balls (or bumps) are formed on an array of bonding pads on a chip, and the chip is mounted (soldered) upside-down to a substrate, such as a circuit board, including ceramic substrates, and the like. In recent years advances in the semiconductor process technologies have dramatically decreased the semiconductor device feature sizes and increased the circuit density of the integrated circuits on the chip. As a consequence this increase in circuit density has resulted in increased density of the array of I/O pads on the chip, with reduced spacing between adjacent pads and reduced pad areas. Because of surface tension, the volume-to-surface area of the solder is maximized and the solder forms a bead or ball (bump). When the area of the bond pad is reduced and hence the wetting surface is reduced in size, the lead balls are also smaller (e.g., <100 um). When the chip is bonded to the substrate, the reduced spacing between the chip and the substrate makes it more difficult to under-fill between the chip and the substrate (circuit board) with Epoxy+filler to strengthen the solder joints and seal the chip on the "circuit board."

Numerous methods for making bonding pads for both wire bond and flip-chip bonding have been reported in the literature. For example, one method for wire bonding is described in U.S. Pat. No. 6,376,353 B1 to Zhou et al. in which an Al—Cu alloy bond pad is used to improve the adhesion of the wire-bond solder to the underlying Cu metallurgy. U.S. Pat. No. 6,544,880 B1 to Akram shows a method in which one or more metal barrier layers are deposited on the underlying copper to improve adhesion. In U.S. Pat. No. 5,523,920 to Machuga et al. a method is described for elevating the bonding pads above a polymeric coating on a circuit board to facilitate soldering operations. Methods relating to flip-chip bonding include U.S. Pat. No. 5,891,756 to Erickson in which a wire bond pad is converted to a flip-chip solder bump by electroless plating nickel (Ni) on the underlying Al pad to prevent oxidation. A solder bump pad is then formed on the nickel.

In U.S. Pat. No. 6,578,754 B1 to Tung an elongated pillar structure is described for flip-chip bonding. The lower portion of the pillar is copper to reduce alpha particles, and the upper portion is PbSn for bonding. U.S. Pat. No. 6,692,629 B1 to Chen et al. uses a plating bus over and along the cutting lines (kerf areas) to each bond pad for plating the bump pads prior to separating the chips by cutting (dicing). In U.S. Pat. No. 6,770,547 B1 to Inoue et al., a method is described for making underfill-less flip-chip bonding that allows defective chips to be replaced on the circuit board, and also avoids alpha particle thereby preventing soft errors in the semiconductor circuit. Several Patent Application Publications have been identified that address the flip-chip technology. In Pub. No. U.S. 2002/0121692 A1 to Lee et al., a method is described to form closely spaced (fine pitch) pillar solder bump pads on a chip for flip-chip bonding. Pub. No. U.S. 2004/0157450 A1 to Bojkov et al. describes a method for directly bonding solder bumps to copper studs.

However, there is still a strong need in the semiconductor industry to improve the bonding pad structure for flip-chip (lead bump) technology for high-density integrated circuits without significantly increasing manufacturing process complexity.

SUMMARY OF THE INVENTION

A principal object of this invention is to make an array of improved bond-pad structures on chips for increased density when flip-chip bonding (soldering) a chip to a substrate, such as on a circuit board or a ceramic substrate.

A second object of this invention is to make an elevated bond-pad structure to improve the under-fill (Epoxy+filler) and concurrently to reduce alpha particle radiation from the lead/tin balls into the silicon chip A third object of this invention is to make sidewall spacers on the elevated bond-pad structures to restrict the wetting area for the Pb/Sn ball (bump) to the top area of the elevated bond pads, thereby reducing the electrical shorting between adjacent bond pads on the chip.

Another objective of this invention, by a second embodiment, is to further reduce the top area of the lead wetting layer on the bond pad by patterning by partial etching which forms a second sidewall on which sidewall spacers are formed to further increase the pad density while eliminating electrical shorts between adjacent bond pads during soldering.

In accordance with the objects of the present invention a method for fabricating elevated bond pads with sidewall spacers to improve bond-pad density is achieved. Typically, integrated circuits are made on an array of chips on a semiconductor substrate (wafer) up to and including a top metal to provide areas for wire bonding or flip-chip bonding to a circuit board or ceramic substrate. In the flip-chip method the bond pads and lead/tin (Pd/Sn) bumps are formed prior to dicing the semiconductor substrate to separate the individual chips (die).

In accordance with the objectives of this invention the method for forming these elevated bond-pad structures by a first embodiment begins by providing a semiconductor substrate having an array of semiconductor chips, each chip has an array of top metal pads that are formed in recesses and are planar with a first insulating layer on the substrate. A second insulating layer is formed over the top metal pads with openings to top surface of the top metal pads. A key feature of this invention is to form elevated bond pads in the openings. The elevated bond pads extend above the surface of the second insulating layer to provide exposed sidewalls on the elevated bond pads to increase the height of the chip over the substrate (circuit board) during flip-chip bonding. Another key feature is to form sidewall spacers on the sidewalls of the elevated bond pads to reduce electrical shorts between adjacent bond pads during soldering. A further advantage of the sidewall spacers is to passivate the copper from oxidation during storage. An under-bump metallurgy layer is deposited and patterned on the top surface of the elevated bond pads. The under-bump metallurgy layer is a multilayer that serves as an adhesion layer, a diffusion barrier layer, and a solder-wetting layer.

The method by a second embodiment is similar to the first embodiment up to and including the formation of the second openings in the second insulating layer. Instead of electroless plating copper, as in the first embodiment, a conformal Ti/TiN barrier layer is deposited, and an etchable metal such as aluminum or aluminum-alloy layer is deposited sufficiently thick to form elevated bond pads over the second openings in the second insulating layer. Using a photoresist mask and plasma etching the aluminum is then patterned to form the elevated bond pads. A key feature of this second embodiment is to use a second photoresist mask and partial anisotropic etching to further reduce the top surface area of the elevated bond pads that result in second sidewalls on the elevated bond pads. Sidewall spacers are formed on the first and second sidewalls by depositing a conformal insulating layer, such as $SiO_2$ or $Si_3N_4$, and anisotropically etching back the insulating layer to the top surface of the Al bond pads. By reducing the top surface area of the elevated bond pads, the array of solder bumps can be formed closer together. As in the first embodiment, an under-bump material multilayer is deposited to provide an adhesion layer, a diffusion barrier layer, and a solder-wetting layer.

DESCRIPTION OF THE PREFERRED EMBODIMENTS

The method for making an array of elevated bond pads is described in detail for a first embodiment. Although the method is described for making an array of elevated bond pads on a chip, only a portion of a substrate having a single bond pad is depicted to simplify the drawings. The method for fabricating elevated bond pads with sidewall spacers to improve bond-pad density is now described.

Figure 1:
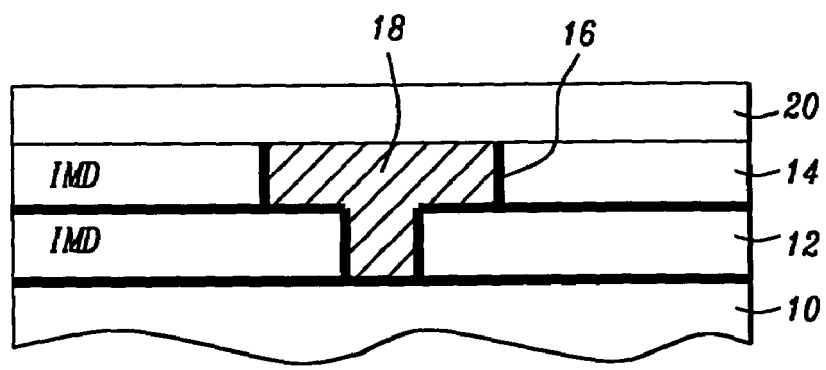
FIGS. 1 through 7 show schematic cross-sectional views of an upper portion of a chip for the sequence of process steps for making the elevated bond pads by a first embodiment.

As shown in FIG. 1, the first embodiment begins by providing a semiconductor substrate 10 having an array of semiconductor chips, also labeled 10. A typical substrate would be single-crystal silicon, gallium arsenide, or the like. The integrated circuits would be fabricated in the substrate and include a number of metal levels and intermetal dielectric layers, such as layer 12, to complete the wiring to the top of the chip. As shown in FIG. 1, a first insulating layer 14 is deposited and recesses are etched for making contact to the underlying metal levels. A relatively thin conformal barrier layer 16 is deposited. The barrier layer 16 is tantalum/tantalum nitride (T/TaN). Next a top metal layer 18 is formed in the recesses in layer 14. For example, the metal layer 18 can be copper formed by Cu plating and polished back to the top surface of the first insulating layer 14 to form the top metal pads 18 for the array of pads on the chip.

Still referring to FIG. 1, a second insulating layer 20 is deposited over the top metal pads 18. The second insulating layer 20 is preferably silicon oxide/silicon nitride, or a silicon oxide/silicon nitride/silicon oxide (ONO), or any porous or non-porous low-k dielectric material, and is deposited to a thickness of between about 1000 and 20000 Angstroms. Openings 22 are etched in the second insulating layer 20 to top surface of the top metal pads 18.

Figure 2:
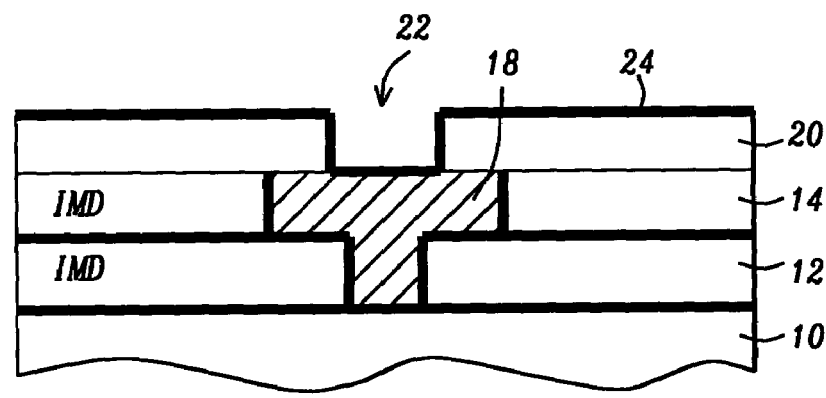

Referring to FIG. 2, a relatively thin conformal second barrier layer 24 is deposited in the openings 22. The second barrier layer is preferably Ta/TaN and is deposited to a thickness of between about 100 and 1000 Angstroms.

Figure 3:
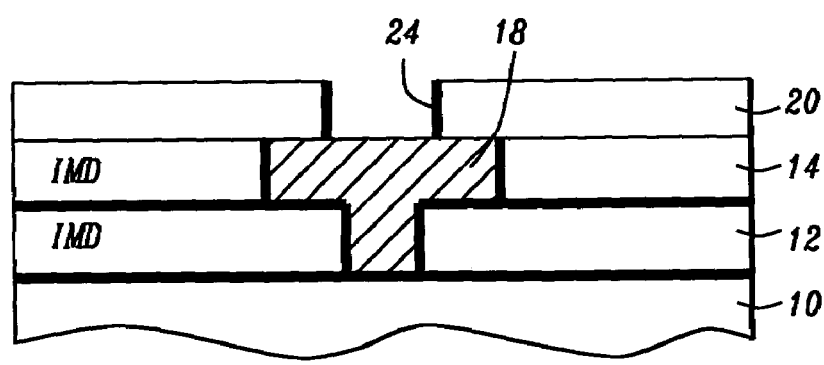

Referring to FIG. 3, the second barrier layer 24 is anisotropically etched back to expose the top surface of the second insulating layer 20 and concurrently to expose the top surface of the top metal pads 18 for electroless plating. As a consequence of anisotropic plasma etching, portions of the second barrier layer 24 are retained on the sidewalls of the openings 22.

Figure 4:
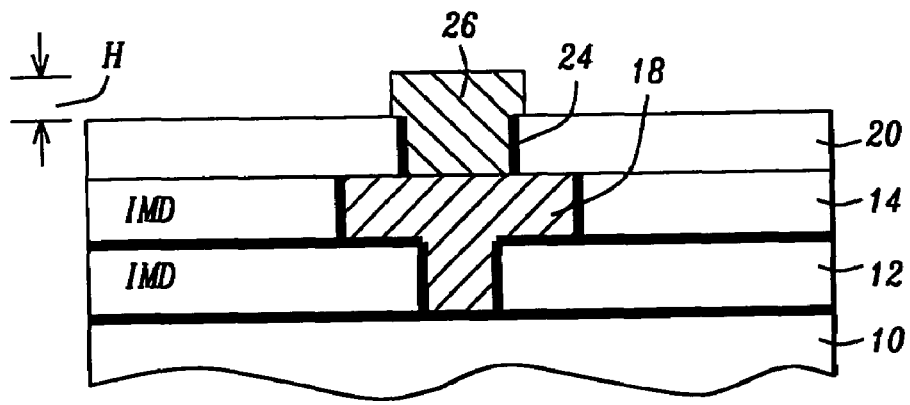

Referring to FIG. 4, one key feature of this invention is to form elevated bond pads 26 in the openings 22. The elevated bond pads 26 are preferably formed by electroless plating copper in the openings 22. As the surface area of the elevated bond pad decreases (to accommodate more bond pads), the height H of the bond pad is increased to compensate for the reduced height (diameter) of the lead ball 32, shown later in FIG. 7. By way of example, the elevated pads 26 are formed to a thickness sufficient to extend above the surface of the second insulating layer 20, to a height of at least greater than 800 Angstroms, as shown in FIG. 4. Alternatively, to better control the profile of the elevated pads 26, a patterned photoresist mask with openings (not shown) can be used aligned over the etched openings 22 in the second insulating layer 20 prior to plating. Ashing is used to remove the photoresist mask after Cu plating.

Figure 5:
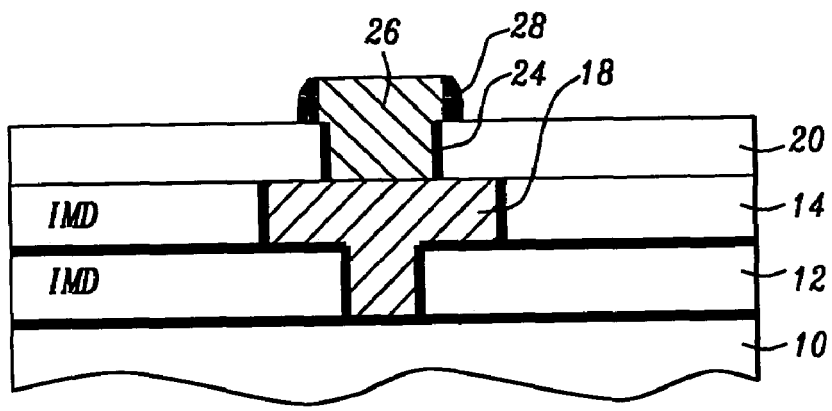
Figure 7:
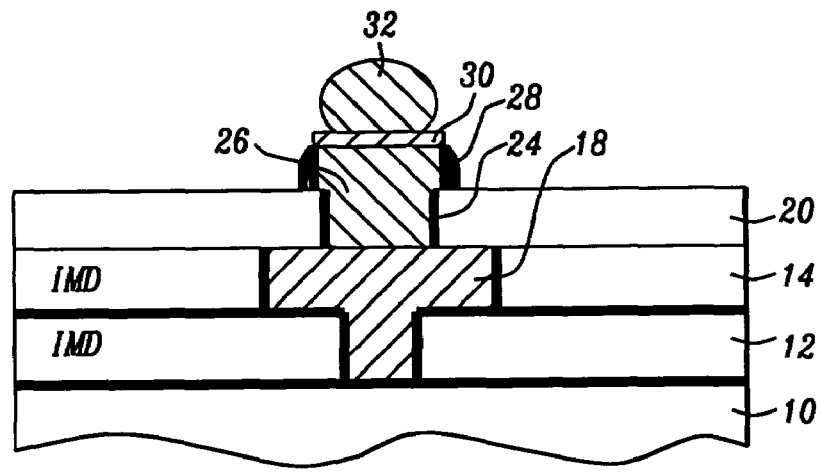

Referring to FIG. 5 and another key feature is to form sidewall spacers 28 on the sidewalls of the elevated bond pads 26 to reduce electrical shorts between adjacent bond pads during soldering. The sidewall spacers 28 prevent the lead/tin from wetting out on the sides of the bond pads causing shorts between adjacent bond pads, as shown in FIG. 7. The sidewall spacers 28 are formed by depositing an insulating layer and anisotropically plasma etching back. The insulating layer is preferably silicon oxide or silicon nitride and the layer is deposited to a thickness of between about 100 and 1000 Angstroms. A further advantage of the sidewall spacers is to prevent the copper from oxidizing during storage prior to flip-chip bonding.

Figure 6:
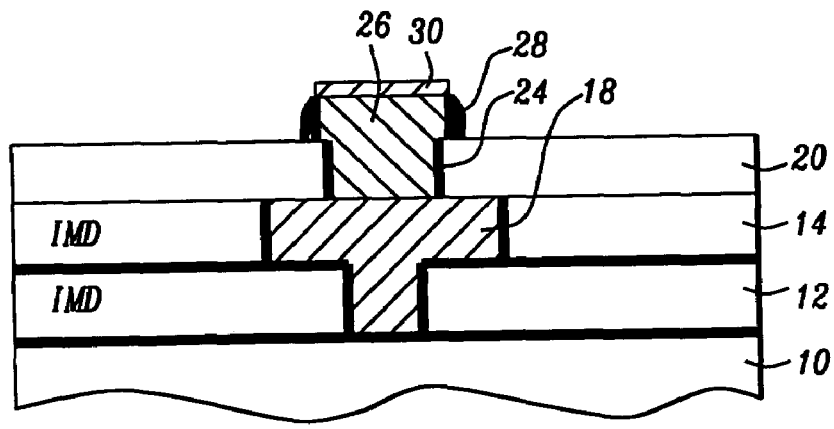

Referring to FIG. 6, next, an under-bump metallurgy layer 30 is deposited and patterned to leave portions on the top surface of the elevated bond pads 26. Layer 30 is preferably a multilayer that serves as an adhesion layer, a diffusion barrier layer, and a solder-wetting layer. For example, the adhesion layer is preferably TiW, Cr, Al, or the like, and is formed to a thickness of between about 100 and 1000 Angstroms. The diffusion barrier layer is preferably CrCu, Ni(V), or the like, and is formed to a thickness of between about 100 and 500 Angstroms, and the solder-wetting layer is preferably Au, Pt, Pd, Ag, Sn or Cu, and is formed to a thickness of between about 100 and 1000 Angstroms. The under-bump material multilayer 30 is preferably deposited by PVD or electroless plating, and is patterned using a photoresist mask and plasma etching to complete the elevated bond-pad structure by a first embodiment.

Referring to FIG. 7, a schematic cross-sectional view of an elevated bond-pad structure after forming the solder balls (bumps) 32 is shown. The solder balls 32 are typically lead/tin (Pb/Sn). Also the increase in height H of the elevated bond pad is depicted in FIG. 7.

Figure 8:
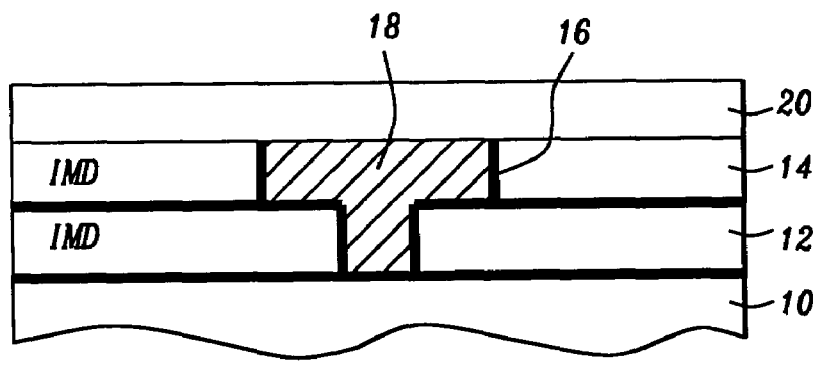
FIGS. 8 through 14 show schematic cross-sectional views of an upper portion of a chip for the sequence of process steps for making the elevated bond pad by a second embodiment.

The method by a second embodiment is similar to the first embodiment up to and including the formation of the second insulating layer, as shown in FIG. 8.

Figure 9:
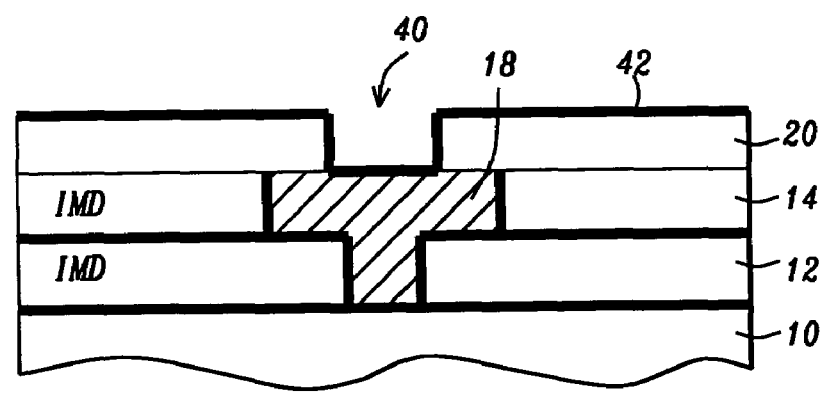

Referring to FIG. 9, openings 40 are etched in the second insulating layer 20 to the underlying top metal layer 18. A conformal barrier layer 42 is deposited over layer 20 and in the openings 40. Layer 42 is preferably Ti/TiN deposited, for example, by CVD or PVD to a preferred thickness of between about 100 and 1000 Angstroms.

Figure 10:
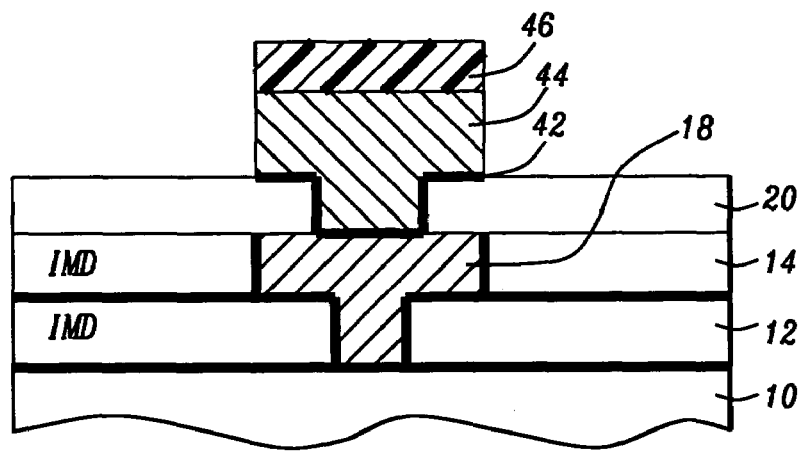

Referring to FIG. 10, an aluminum or aluminum-alloy layer 44 is deposited sufficiently thick to form elevated bond pads over the openings 40 in the second insulating layer 20. Layer 44 is deposited to have a preferred thickness of at least 2000 Angstroms.

Still referring to FIG. 10, a first photoresist mask 46 and plasma etching are used to pattern the aluminum to form elevated bond pads, also labeled 44, and having first sidewalls 48. The Al layer 44 is etched using an anisotropic plasma etcher and a standard etchant gas currently used in industry, such as a one containing $Cl_2$, $BCl_3$, and the like. The barrier layer 42 is then etched to the second insulating layer 20 using anisotropic plasma etching and an etchant gas such as one commonly used in industry.

Figure 11:
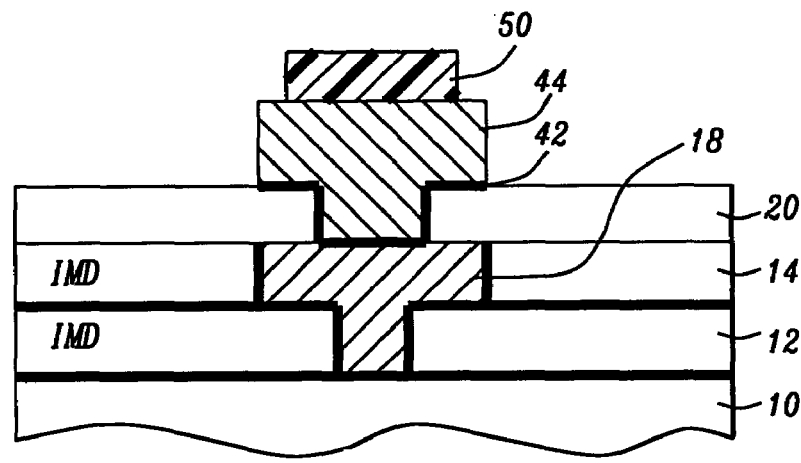
Figure 12:
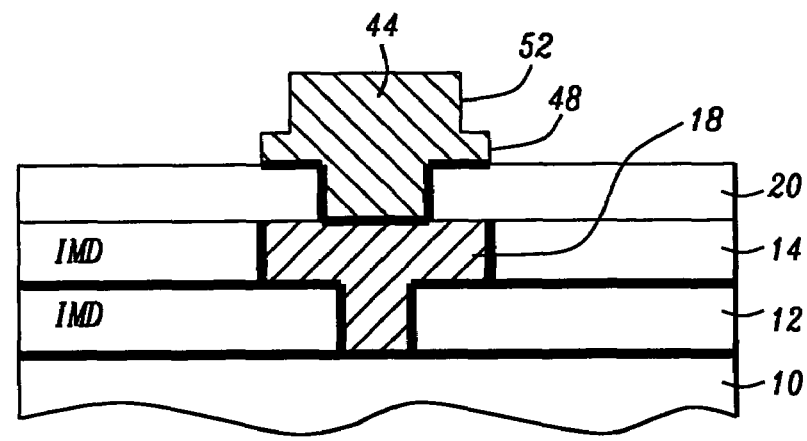

Referring to FIG. 11, the first photoresist mask 46 is removed, for example by ashing in $O_2$ or $O_3$. A key feature of this second embodiment is to use a second photoresist mask 50 and partial anisotropic etching to further reduce the top surface area of the elevated bond pads 44, as shown in FIG. 12. This results in second sidewalls 52 on the elevated bond pads 44. The etching is carried out preferably using a plasma etcher and an etchant gas such as one containing chlorine and/or $BCl_3$ and the like as commonly used in industry.

Figure 13:
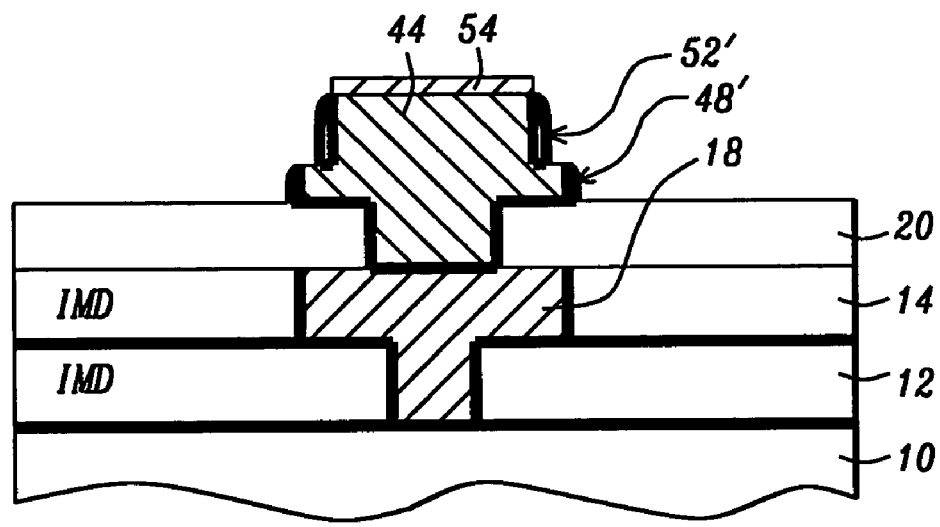

Referring to FIG. 13, sidewall spacers 48' are formed on the first sidewalls 48, and sidewall spacers 52' are formed on the second sidewalls 52. The spacers are formed concurrently by depositing a conformal insulating layer, such as $SiO_2$ or $Si_3N_4$, and anisotropically plasma etching back the insulating layer to the top surface of the Al bond pads 44. By reducing the top surface area of the elevated bond pads 44, the array of solder bumps can be formed closer together.

Still referring to FIG. 13, as in the first embodiment, an under-bump material multilayer 54 is deposited to provide an adhesion layer, a diffusion barrier layer, and a solder-wetting layer.

Figure 14:
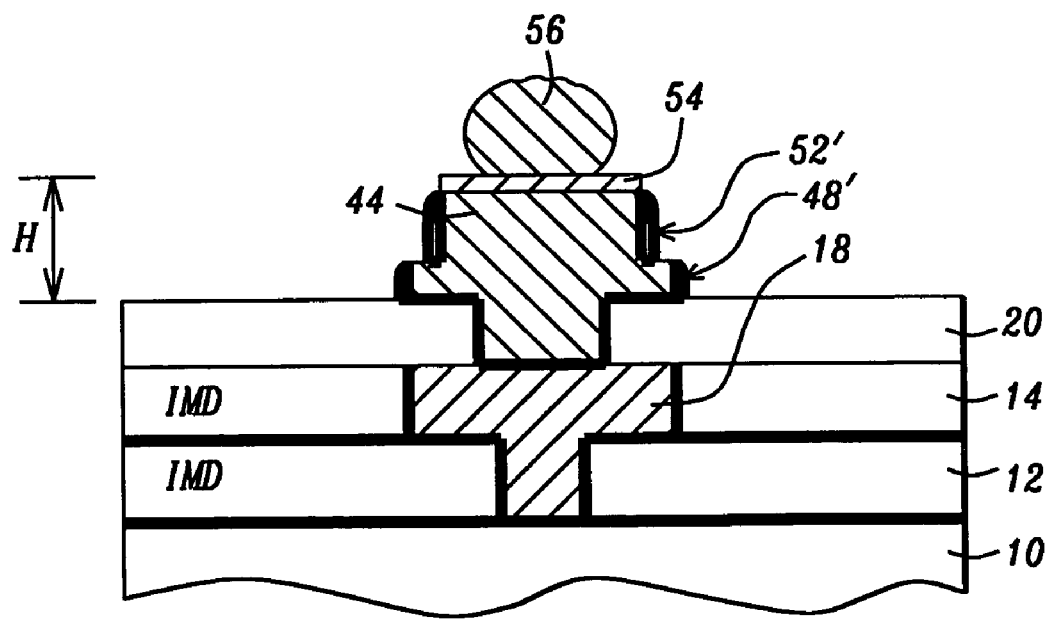

Referring to FIG. 14, a schematic cross-sectional view of an elevated Al bond-pad structure 44 after forming the solder balls (bumps) 56 is shown. The solder balls 56 are typically lead/tin (Pb/Sn). Also the increase in height H of the elevated bond pad is depicted in FIG. 14.

While the invention has been particularly shown and described with reference to the preferred embodiments thereof, it will be understood by those skilled in the art that various changes in form and details may be made without departing from the spirit and scope of the invention.

What is claimed is:

1. A method for fabricating elevated bond pads on semiconductor chips comprising the steps of:
providing a semiconductor substrate having an array of said semiconductor chips each with an array of top metal pads, said top metal pads in recesses and planar with a first insulating layer on said substrate;
forming a second insulating layer over said top metal pads and with openings to top surface of said top metal pads;
forming elevated bond pads in said openings and extending above surface of said second insulating layer, with exposed sidewalls on said elevated bond pads;
forming sidewall spacers on said exposed sidewalls; and
forming an under-bump material barrier layer selectively on the top surface of said elevated bond pads wherein said under-bump material barrier layer is a multilayer of an adhesion layer selected from the group consisting of TiW, Cr, and Al, a diffusion barrier layer selected from the group consisting of CrCu and Ni(V), and a solder-wetting layer selected from the group consisting of Au, Pt, Pd, Ag, Sn, and Cu.

2. The method of claim 1, wherein said semiconductor chips have integrated circuits (devices) electrically connected to said top metal pads.

3. The method of claim 1, wherein said top metal pads are formed by depositing a conformal barrier layer of Ta/TaN and filling said recesses with copper.

4. The method of claim 1, wherein said second insulating layer is a dual-layer of silicon oxide and silicon nitride or a tri-layer of silicon oxide-silicon nitride-silicon oxide and is deposited to a thickness of between 1000 and 20000 Angstroms.

5. The method of claim 1, wherein said elevated bond pads are formed by:
depositing a conformal Ta/TaN barrier layer and anisotropically etching back to leave said Ta/TaN barrier layer on the sidewalls of said openings while exposing the top surface of said second insulating layer and top surface of said top metal pads in said openings; and
electroless plating copper selectively in said openings, and said elevated bond pads have a height of at least greater than 800 Angstroms above top surface of said second insulating layer.

6. The method of claim 1, wherein said sidewalls spacers are formed by depositing a conformal insulating layer of silicon oxide or silicon nitride formed to a thickness of between about 100 and 1000 Angstroms, and anisotropically etching back said insulating layer to top surface of said elevated bond pads.

7. The method of claim 1, wherein said under-bump material barrier layer is deposited and patterned using a photoresist mask to leave portions on top surface of said elevated bond pads.

8. A method for fabricating elevated bond pads on semiconductor chips comprising the steps of:
providing a semiconductor substrate having an array of said semiconductor chips each with an array of top metal pads in recesses and planar with a first insulating layer on said substrate;
forming a second insulating layer over said top metal pads and with openings to top surface of said top metal pads;
depositing a conformal barrier layer and an electrically conducting layer and patterning to form elevated bond pads in and aligned over said openings and extending above the surface of said second insulating layer with exposed first sidewalls on said elevated bond pads;
patterning said elevated bond pads by partial anisotropically etching to further reduce the top surface area and form second sidewalls on said elevated bond pads;
forming sidewall spacers on said exposed first and second sidewalls; and
forming an under-bump material barrier layer selectively on the top surface of said elevated bond pads wherein said under-bump material barrier layer is a multilayer of an adhesion layer selected from the group consisting of TiW, Cr, and Al, a diffusion barrier layer selected from the group consisting of CrCu and Ni(V), and a solder-wetting layer selected from the group consisting of Au, Pt, Pd, Ag, Sn, and Cu.

9. The method of claim 8, wherein said semiconductor chips have integrated circuits (devices) electrically connected to said top metal pads.

10. The method of claim 8, wherein said top metal pads are formed by depositing a conformal barrier layer of Ta/TaN and filling said recesses with copper.

11. The method of claim 8, wherein said second insulating layer is a dual-layer of silicon oxide and silicon nitride or a tri-layer of silicon oxide-silicon nitride-silicon oxide and is deposited to a thickness of between 1000 and 20000 Angstroms.

12. The method of claim 8, wherein said elevated bond pads are formed by:
  depositing a conformal Ta/TaN barrier layer and depositing an aluminum alloy to fill said openings;
  using a first photoresist mask and anisotropically etching to form said elevated bond pads over said openings and to form said first sidewalls on said elevated bond pads; and
  using a second photoresist mask and partially anisotropically etching to reduce the top surface of said elevated bond pads and to form said second sidewalls on said elevated bond pads, and said elevated bond pads have a height of at least greater than 800 Angstroms above the top surface of said second insulating layer.

13. The method of claim 8, wherein said sidewall spacers are formed by depositing a conformal insulating layer of silicon oxide or silicon nitride formed to a thickness of between about 100 and 1000 Angstroms, and anisotropically etching back to top surface of said elevated bond pads.

14. The method of claim 8, wherein said under-bump material barrier layer is deposited and patterned using a photoresist mask to leave portions on the top surface of said elevated bond pads.

15. Elevated bond-pads on semiconductor chips comprised of:
  a semiconductor substrate having an array of said semiconductor chips each with an array of top metal pads, said metal pads in recesses and planar with a first insulating layer on said substrate;
  a second insulating layer over said top metal pads and with openings to top surface of said top metal pads;
  said elevated bond pads in said openings and extending above the surface of said second insulating layer, with sidewalls on said elevated bond pads;
  sidewall spacers on said sidewalls; and
  an under-bump material barrier layer on the top surface of said elevated bond pads wherein said under-bump material barrier layer is a multilayer of an adhesion layer selected from the group consisting of TiW, Cr, and Al, a diffusion barrier layer selected from the group consisting of CrCu and, Ni(V), and a solder-wetting layer selected from the group consisting of Au, Pt, Pd, Ag, Sn, and Cu.

16. The structure of claim 15, wherein said second insulating layer is a dual-layer of silicon oxide and silicon nitride or a tri-layer of silicon oxide $SiN/SiO_2$ and has a thickness of between 1000 and 20000 Angstrom.

17. The structure of claim 15, wherein said elevated bond pads are copper formed by electroless plating and have a height of at least greater than 800 Angstroms above the top surface of said second insulating layer.

18. The structure of claim 15, wherein said elevated bond pads are an aluminum alloy and have a height of at least greater than 800 Angstroms above the top surface of the second insulating layer and said elevated bond pads are recessed and have second sidewalls on said elevated bond pads to reduce the top surface areas of said elevated bond pads, and wherein said sidewall spacers are silicon oxide or silicon nitride.

* * * * *